United States Patent [19]

Dumbeck

[11] 4,063,112

[45] Dec. 13, 1977

[54] INDUCTION MOTOR LOAD MONITOR AND CONTROL APPARATUS

[76] Inventor: Robert Francis Dumbeck, 104 Anderson Drive, Elgin, Tex. 78621

[21] Appl. No.: 675,780

[22] Filed: Apr. 12, 1976

Related U.S. Application Data

[63] Continuation-in-part of Ser. No. 548,011, Feb. 7, 1975, abandoned.

[51] Int. Cl.² ............................................. G08B 21/00
[52] U.S. Cl. .................................... 307/116; 340/271; 318/490; 324/161
[58] Field of Search .......................... 340/267 R, 271; 307/116, 120, 124; 324/161, 168; 318/490

[56] References Cited

U.S. PATENT DOCUMENTS

| | | | |
|---|---|---|---|
| 3,525,026 | 8/1970 | Ahamed | 318/490 X |
| 3,611,343 | 10/1971 | Schoenbach | 324/161 |
| 3,739,367 | 6/1973 | Fathauer | 340/248 P X |
| 3,906,796 | 9/1975 | Dumbeck | 323/68 |

OTHER PUBLICATIONS

DC Motor Speed Control, IBM Tech. Disc. Bulletin, D. E. Brownbeck vol. 13, No. 1, June 1970.

*Primary Examiner*—Robert K. Schaefer
*Assistant Examiner*—Morris Ginsburg
*Attorney, Agent, or Firm*—Laurence R. Brown

[57] ABSTRACT

Induction motor load conditions are monitored by sensing the slip speed of the motor which is linear over a large operating range including the 100% load condition. Electronic trigger pulses are derived from motor shaft rotation to operate a one-shot waveform generator having a selected signal pulse time duration set at the 100% motor load condition to produce a 3.5 millisecond difference from the time between two trigger pulses. Thus, as the slip speed varies the signal pulse duration varies and thus becomes a monitor of the load condition. Both analog and digital embodiments are described, and utilization devices may be an analog meter display or an alarm circuit triggered by means of an intervening threshold comparison circuit. The monitoring circuits are used to sense variations of speed and indicate on a meter a scale factor of load or horsepower, etc. as related to various drive means without interconnections other than shaft speed detectors.

20 Claims, 10 Drawing Figures

INDUCTION MOTOR LOAD MONITOR AND CONTROL APPARATUS

This is a continuation-in-part application of Ser. No. 548,011 filed Feb. 7, 1975 now abandoned in favor of this application.

This invention relates to motor load monitoring and control apparatus and more specifically it relates to measurement of induction motor slip speed to produce electronic signals representative of motor load contains.

BACKGROUND

Many prior art load control systems have been proposed measuring motor current. However, this parameter varies considerably with ambient temperature variations and furthermore it is difficult to adapt a motor in the field to such measurements. In general also the variations of current with load is not linear over a large enough range of load conditions and thus becomes difficult to use for precision indications of loading. Furthermore, the current characteristics of different size motors vary considerably so that custom designed circuitry is necessary for different motor sizes.

While it is known that motor slip speed is a good indicator of load conditions substantially linear over a large range of load conditions, that parameter has not been effectively used for simple load monitoring and control application. Thus, complex and costly electronic timing or counting circuits using precision type oscillators requiring temperature ovens or other precision type equipment have been necessary for measuring the small number of slip RPM such as 30 out of a high nominal rotating RPM such as 1800.

OBJECTIVES

It is therefore a general object of this invention to provide for use with induction motors simplified but precise electronic, motor load monitoring and control apparatus.

A more specific object of this invention is to provide apparatus for monitoring and indicating the slip speeds of induction motors.

Another object of the invention is to provide versatile motor load control apparatus that may be installed and used in the field under various ambient temperature conditions and which does not require significant wiring changes.

A significant object of the invention is to provide universal type apparatus for indicating load conditions of motors of various size.

Other objects, features and advantages of the invention will be set forth throughout the following description.

BRIEF DESCRIPTION OF THE INVENTION

There is therefore afforded by this invention a simplified motor accessory that may be installed without access to the motor wiring, and which will operate under various ambient conditions for monitoring the motor load conditions and controlling motor actuated equipment as a function of motor loading. The load conditions are monitored by using the nearly linear 10 to 120% load versus slip RPM induction motor characteristic as a measuring parameter. The time taken for each shaft rotation is thus compared with a standard electronic one-shot square wave duration in a digital version or a threshold potential in an analog version to identify the amount of slip present and therefore the load condition of the motor. The apparatus is self contained except for a magnetic sensor that is installed adjacent the motor shaft to derive a trigger pulse from the motor shaft rotation. Motor load is indicated in analog fashion by a meter movement. Threshold type output signals are available to operate electronic or relay control circuits at selectively variable loading conditions.

THE DRAWINGS

A preferred embodiment of the invention is set forth hereinafter and described with reference to the accompanying drawings, wherein.

DETAILED DESCRIPTION

Figure 1:
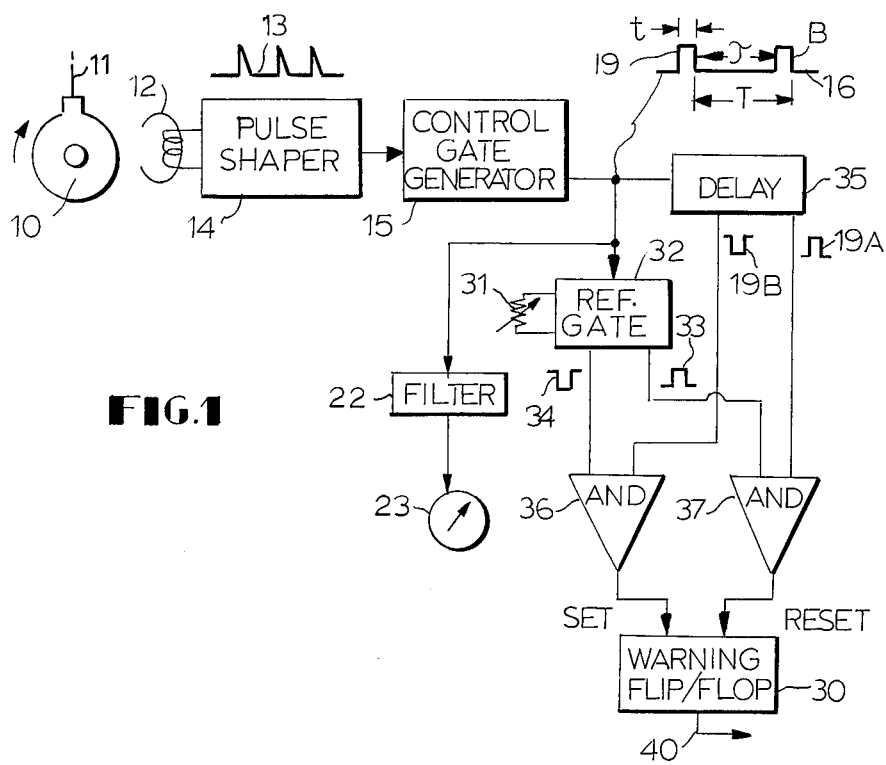
FIG. 1 is a simplified block diagram of the motor load monitoring equipment provided by this invention.

With reference to FIG. 1, a motor shaft 10 rotates as shown by the arrow to present a projecting ferrous portion 11 to a magnetic head detector 12 each revolution of the shaft to thereby indicate by a succession of pulses 13 the speed of rotation of the motor. The derived pulses are appropriately shaped in pulse shaper circuit 14 to provide trigger pulses for the control gate generator circuit 15, which produces an output waveform 16.

Figure 2:
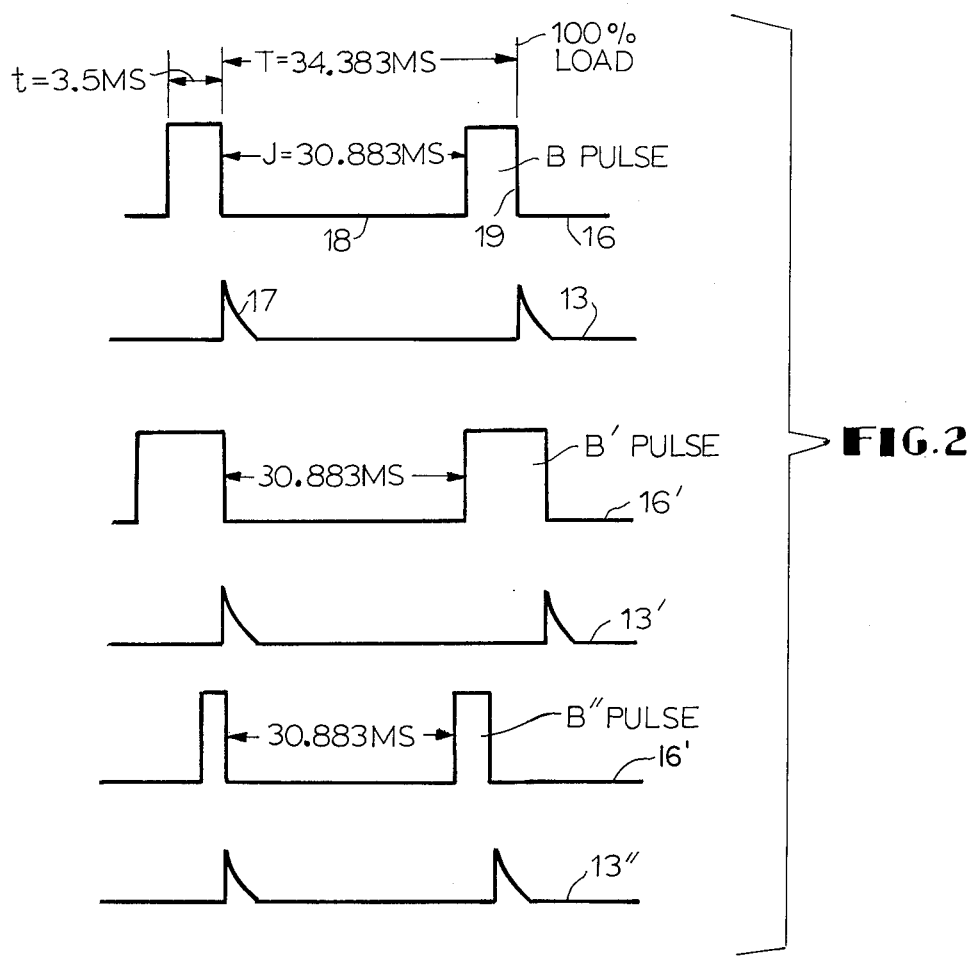
FIG. 2 is a waveform chart illustrating the operational principle of digital voltage comparison circuits used in the invention.

As may be seen in more detail from the waveforms in FIG. 2, the control gate generator basically comprises a multivibrator one-shot square wave generator. Thus, each trigger pulse 17 generates a square-wave 18 with a duration time J that is of a predetermined basic time such as 30.883 milliseconds, which is shorter than the normal interval between two successive trigger pulses.

Figure 3:
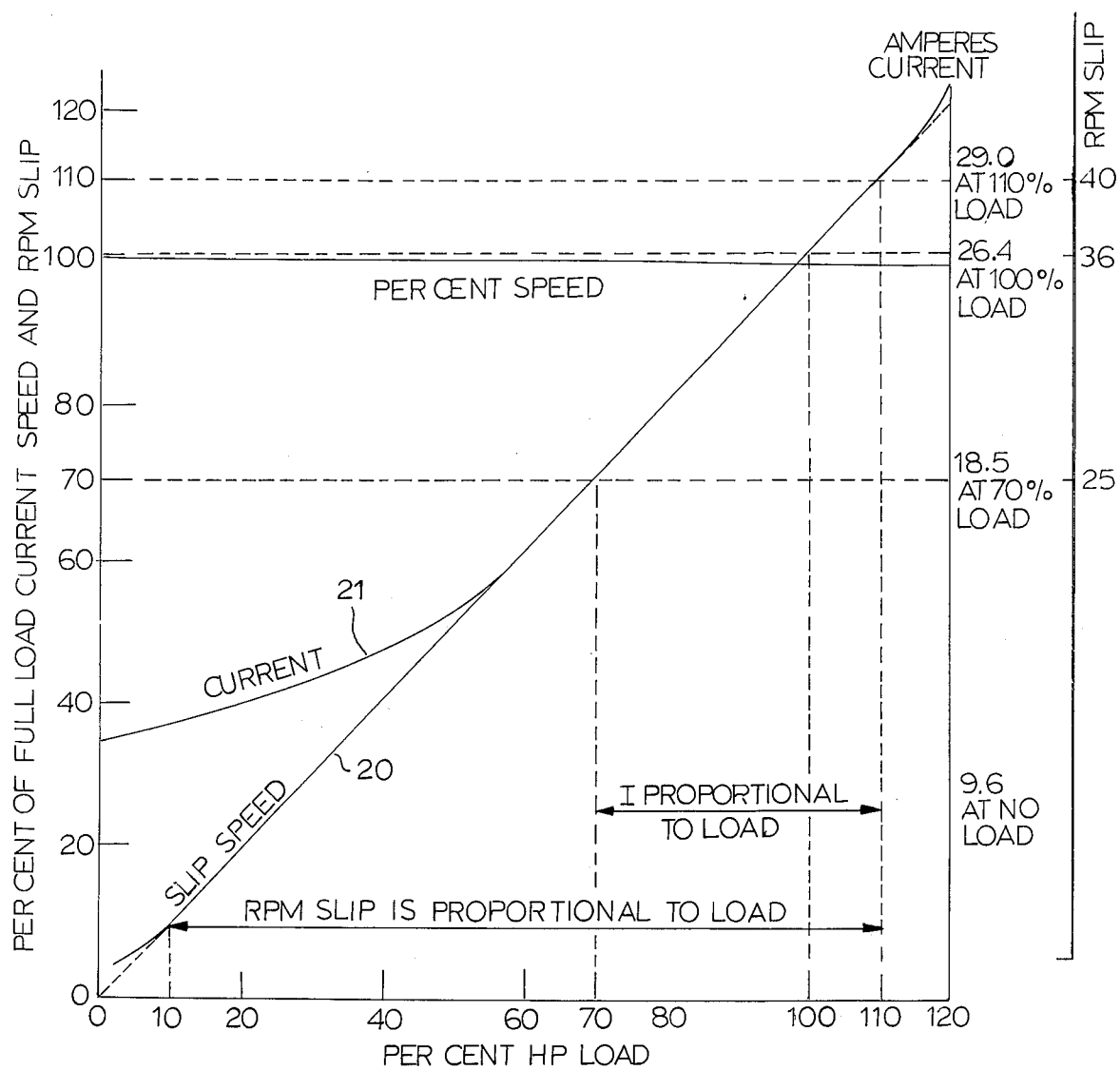
FIG. 3 is a graph showing motor load characteristics as a function of slip speed as utilized in practicing this invention.

In deriving the duration time for square-wave 18, a particular induction squirrel cage motor characteristic such as that shown in FIG. 3 may be used as a reference. For a motor shaft speed of 1800 RPM at no load the slip is 1 RPM for a no-load speed of 1799 RPM. At full load a slip of 36 RPM is encountered for a speed of 1763 RPM. At full load speed the time for one shaft revolution is 34.383 millisecond, which in FIG. 2 is the designated time T between two successive trigger pulses 17.

At full load, the positive going gating signal 19 denoted the B pulse may be chosen to have a duration $t$ of 3.5 milliseconds for example. Thus, the duration time J of square-wave 18 is the difference equal to 30.883 milliseconds. Since waveform 18 is of fixed time duration, the B pulse 19 portion of the waveform will vary in time duration as a function of the load in a substantially linear manner as seen from graph line 20 in FIG. 3 over a range from about 10% of load to about 110% of load. For comparison purposes it is seen that this characteristic will give a larger linear range than the motor current characteristic shown on graph line 21, and thus is preferred for this reason as well as the ease of field installation, since the motor wiring circuits need not be interfered with in installation of the detector 12 (FIG. 1).

If the load is more than full rated load, for example 125%, then the B pulse waveform 19 characteristic changes in the manner shown by waveform 16' in the presence of trigger pulse waveform 16' in which the trigger pulses are further apart in time, due to increased slippage. The waveform B' therefore has a longer duration. Conversely for less than full load, for example 75% load, the waveform B" will have a time duration t less than 3.5 milliseconds as represented by the B" pulse waveform. Accordingly, for an induction motor such as a Nema type B squirrel cage motor exemplified by the characteristics of FIG. 3, the load relationship chart which follows will represent a substantially linear proportionality to the duration t of the B gate pulses 19 produced by the control gate generator 15.

| % of Load | B Gate Pulse Duration (M.S.) |
|---|---|
| 75 | 3.236 |
| 80 | 3.288 |
| 85 | 3.341 |
| 90 | 3.394 |
| 95 | 3.447 |
| 100 | 3.500 |
| 105 | 3.553 |
| 110 | 3.606 |
| 115 | 3.659 |
| 120 | 3.706 |
| 125 | 3.733 |

Note that at the higher load end of the date the linearity changes as may be seen by reference to curve 20 in FIG. 3.

Accordingly, it may be seen that with the filter circuit 22 of FIG. 1, the B waveform signal pulses 19 may be converted to a direct current level to operate the scale of a d-c analog meter 23 that will monitor and visually display the percentage of motor load.

To digitally monitor the load characteristics and provide warning signals suitable for control of motor load devices or systems, the warning flip-flop 30 may be used for operation by the B waveform signal pulses 19 produced by control gate generator 15. A desired threshold load warning or alarm condition may be set by means of variable adjustment means 31 on reference warning gate generator 32. Thus, positive 33 and negative 34 square waveforms of predetermined time duration are produced as the output signals of a multivibrator of the one-shot variety that is triggered by the leading edge of the B waveform 19 for synchronization purposes.

Delay circuit 35 provides a short delay of about forty nanoseconds and produces delayed B waveform pulses 19 in positive (19A) and negative (19B) polarity. Comparison circuits such as AND circuits 36 and 37 therefore can process the corresponding negative and positive pulses to set and reset the warning flip-flop 30 as a function of different time duration of input square wave signals. The delay prevents erroneous triggers at the warning gate comparison circuits 36 and 37 due to circuit timing conditions.

Suppose the predetermined load threshold level of 110% is selected by the threshold adjustment means 31. This provides reference pulses 33, 34 with a time duration of the 4.1 milliseconds (as shown on the chart hereinbefore set forth). These pulses are time synchronized with the start of the B pulses of waveform 19. Then whenever the B pulse 19 from control gate generator is longer than the warning gate pulse 34, the AND circuit 36 produces a trigger pulse which sets warning flip-flop 30 to produce an alarm at output lead 40. Conversely if the control gate pulse 19 is shorter than the warning gate pulse 33, then AND gate 37 resets the warning flip-flop to show that the motor is not past the overload threshold set on adjustment 31.

Figure 4:
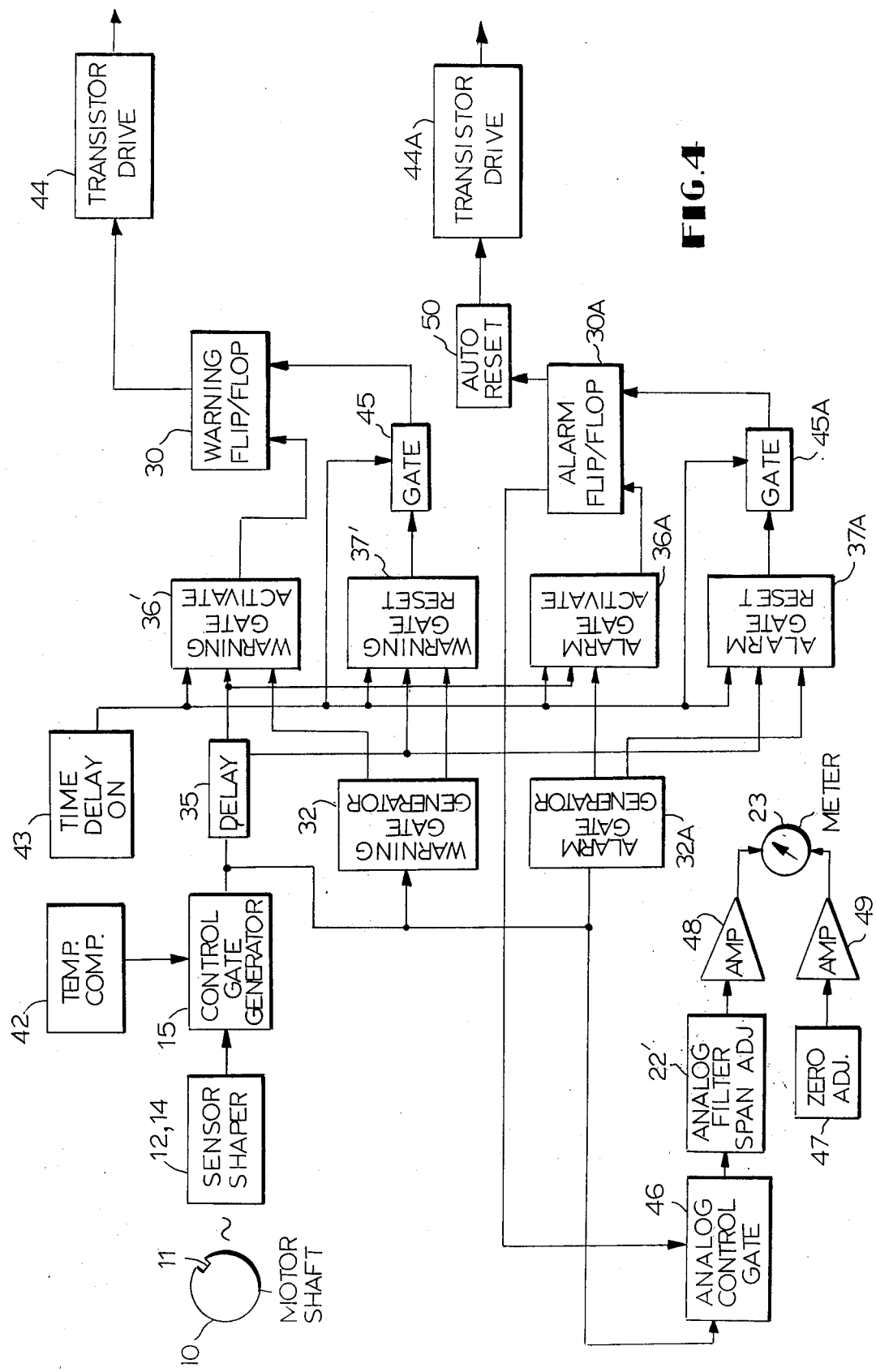
FIG. 4 is a more detailed block diagram of motor load monitoring and control circuits embodying the invention.

More comprehensive instrumentation is typified by the system shown in FIG. 4. Similar parts operating in the manner previously described are given similar reference numbers where primed numbers indicate slight modifications and letter suffixes identify duplicated circuits. Thus, the general operation of this system is similar to that of FIG. 1.

The temperature conpensation network 42 will prevent changes in the control gate pulse duration with changes in ambient temperature over a wide range of field applications.

Time delay circuit 43 keeps the comparison circuits 36 and 37 inactive until after the motor has reached an equilibrium condition when first started up and through gate circuits 45 will prevent an alarm condition to be reset at flip-flops 30 until after a warm-up period set at time delay 43.

Output transistor drive circuits 44 can provide power for actuation of relays or use in system control functions.

In the analog meter circuitry the control gate 46 prevents an analog output when there is an alarm condition present. A span adjustment is afforded in filter circuit 22' and a zero adjust circuit 47 is provided, these adjustments respectively controlling operation of the meter amplifiers 48 and 49.

Operation of this system is discussed with reference to the schematic circuit diagram of FIG. 5, which has corresponding reference characters to identify the respective circuits shown in the FIG. 4 block diagram.

The detector 12 is a hall effect device such as an Airpax mini 40004 magnetic pickup or equivalent which is operable with either a void or projection on the motor shaft to generate a positive or negative pulse. The sensed pulse is AC coupled by capacitor 51 into high gain amplifier 14 which squares the trigger pulse. Bias resistor networks are shown including the trigger adjust resistor 52. The amplifiers 14 such as type LM324 provide a high input impedance, temperature compensated input stage applied to the one-shot circuit 15, which may be a CD4047AE integrated circuit. A low to high transition encountered once per shaft revolution will fire the one-shot circuit 15. The RC timing circuit has an adjustment resistor 53 for setting the time duration J previously discussed, and the temperature compensation network diodes 54 are selected for operation at 1735 RPM in the example set forth hereinbefore to produce an offset decrease in voltage to decrease current into the one-shot as temperature increases. This reduces errors in pulse duration decrease with increasing temperature that would otherwise occur.

The delay circuit 35 may be a CD4009AE integrated circuit with six inverting buffer amplifiers which have a delay of 6.6 nanoseconds for a total delay of 40 nanoseconds and which provides inverted outputs at the respective leads 55 and 56.

The time delay on circuit 43 allows the motor to warm-up or come to equilibrium. A typical delay is twenty seconds but a choice of up to 220 seconds is provided by resistor 57 as a coarse adjustment between 0 and 10 megohms, and with resistor 58 as a fine adjustment of from one to twenty seconds to produce a selectable R-C time delay. Typically the voltage at terminal 59 will be provided when the motor is started. Diode 60 is used to discharge capacitor 61 quickly when the power is removed. Diode 62 provides a positive feedback to insure a fast oscillation free switch action to make output lead 63 high at the end of the time period for activiating the gates to which it is connected.

One-shots 32 and 32A operate similarly and may be CD4047AE integrated circuits. An R-C timing network 31 provides adjustment resistor 64 for selecting the time duration of the output pulse for the purposes heretofore discussed. The range selectable is 75 to 105% of the rated load under the operating conditions herein set forth.

Warning AND gates 36 (and 36A, etc.) are opened by a low to high transition at all the input leads and thus must await the time delay 43 output signal for activation. The one-shot 15 control output pulse is compared with the one-shot 32 warning pulse in gate 36. In this respect the warning one-shot 32 is triggered by the low to high transition of the control output pulse at lead 70, and provides at output leads 71 and 72 the output timed square-wave pulse in opposite polarities. The high to low output transition pulse is provided at lead 72 and is routed by comparison AND gate 37 to reset flip-flop 30. The low to high output transition at least 71 is routed by way of comparison AND gate 36 to set flip-flop 30.

The AND gates 36, etc. may be Nand gates such as in CD4012 AEintegrated circuit packages. When the control pulse from one-shot circuit 15 is longer in duration than the warning pulse from one-shot circuit 32 (and the time delay 43 is high) then the flip-flop 30 will be set, and an alarm condition will be indicated by relay 75 in transistor circuit 44.

The AND gate 37 operates to reset flip-flop 30 when the control one-shot 15 has a pulse duration less than that of the warning one-shot 32 pulse as delayed and inverted at lead 55. Thus, flip-flop 30 will be in set for the duration of any overload condition selected at setting 64 and will be reset when the load condition returns below the selected threshold value. Amplifier-inverter circuits 77 and the like such as two input AND gate 78 may be circuits provided in CD4011AE type integrated circuits. The AND gate 78 serves to prevent reset of flip-flop 30 until the time delay set at 43 has expired after the motor is first turned on.

The adjustment network 31A of warning one-shot 32A operates similarly but provides for an adjustment between 105 and 125% of rated motor load conditions as set by adjustable resistor 64A, and when the load exceeds this set value the AND circuit 36A serves to set flip-flop 30A and operate relay 80 through transistor 44A and the automatic reset circuit 50.

The flip-flop circuits 30 may be those on a CD4013AE integrated circuit connected as a latching set-reset flip-flop. Capacitors 85 and 85A comprise an input filter.

Automatic reset circuit 50 is optional and has the R-C network 90 to establish the reset off time and cycle rate. Diode 91 provides a fast switching network for inverter amplifiers 92, and inverter amplifiers 93 serve as a gate buffer for driving transistor 44A.

The analog control AND gate 46 is driven from the reset line 94 from alarm flip-flop 30A so that when an alarm is not present to inhibit the circuit, the meter 23 will read the pulse widths ($t$) of control pulses at lead 70 as averaged or filtered in R-C integrator network 22'. The time constant is approximately ten milliseconds. Potentiometer 95 is a span adjust resistance for the meter amplifier circuit. Potentiometer 96 is similarly a meter zero adjust device and the two potentiometers are chosen with identical temperature coefficients to track each other over the operating temperature range.

The meter 23 is a 1 milliampere taut band meter driven by dual differential amplifiers 48, 49, which are set up for identical gains of 1.96 by the resistor bias networks. Diode-resistor network 98 is a temperature compensation network for the entire analog section and meter readout. Capacitor 99 filters the amplifier 48 feedback leg.

Figure 5:
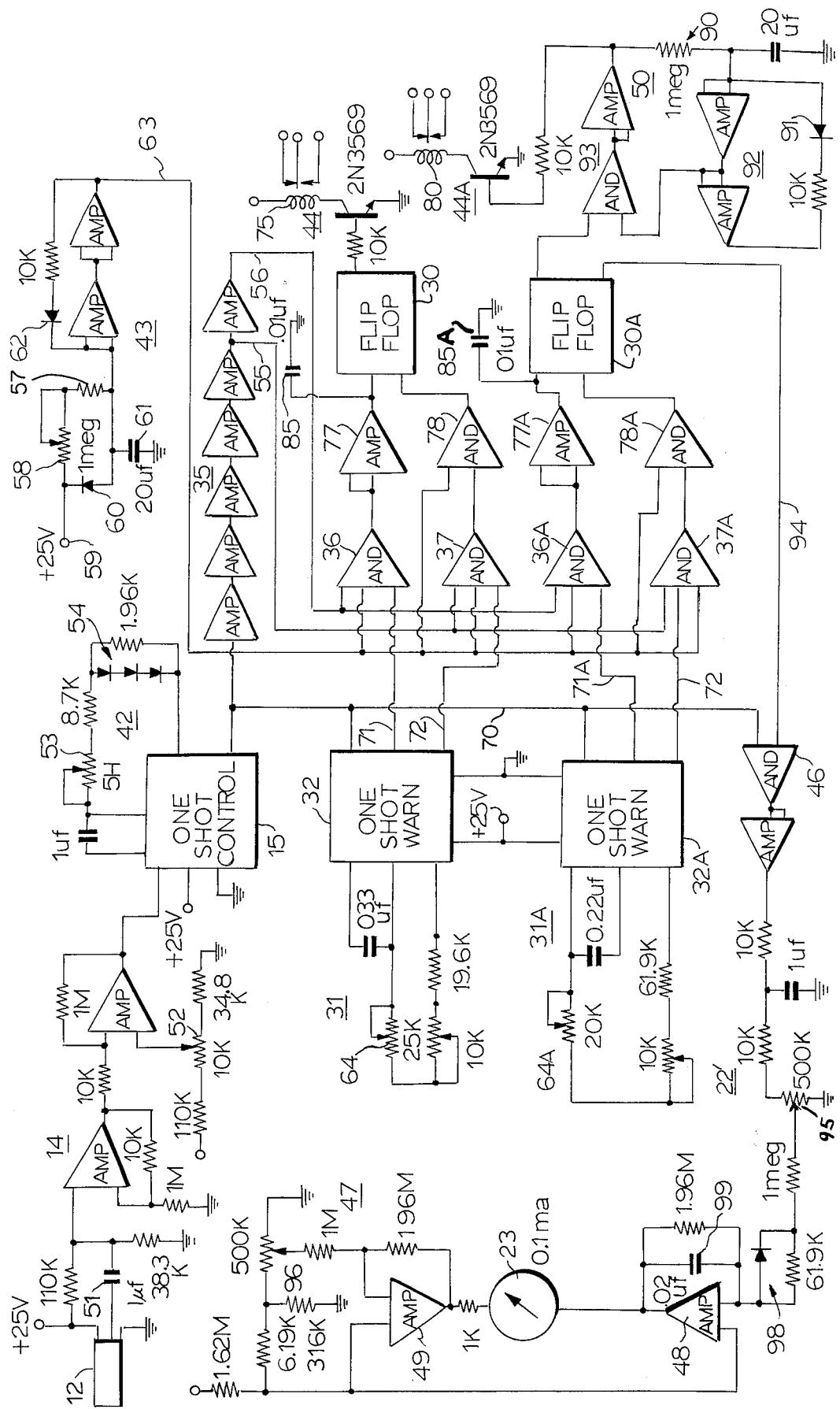
FIG. 5 is a schematic circuit diagram of a preferred digital embodiment of the invention.
Figure 6:
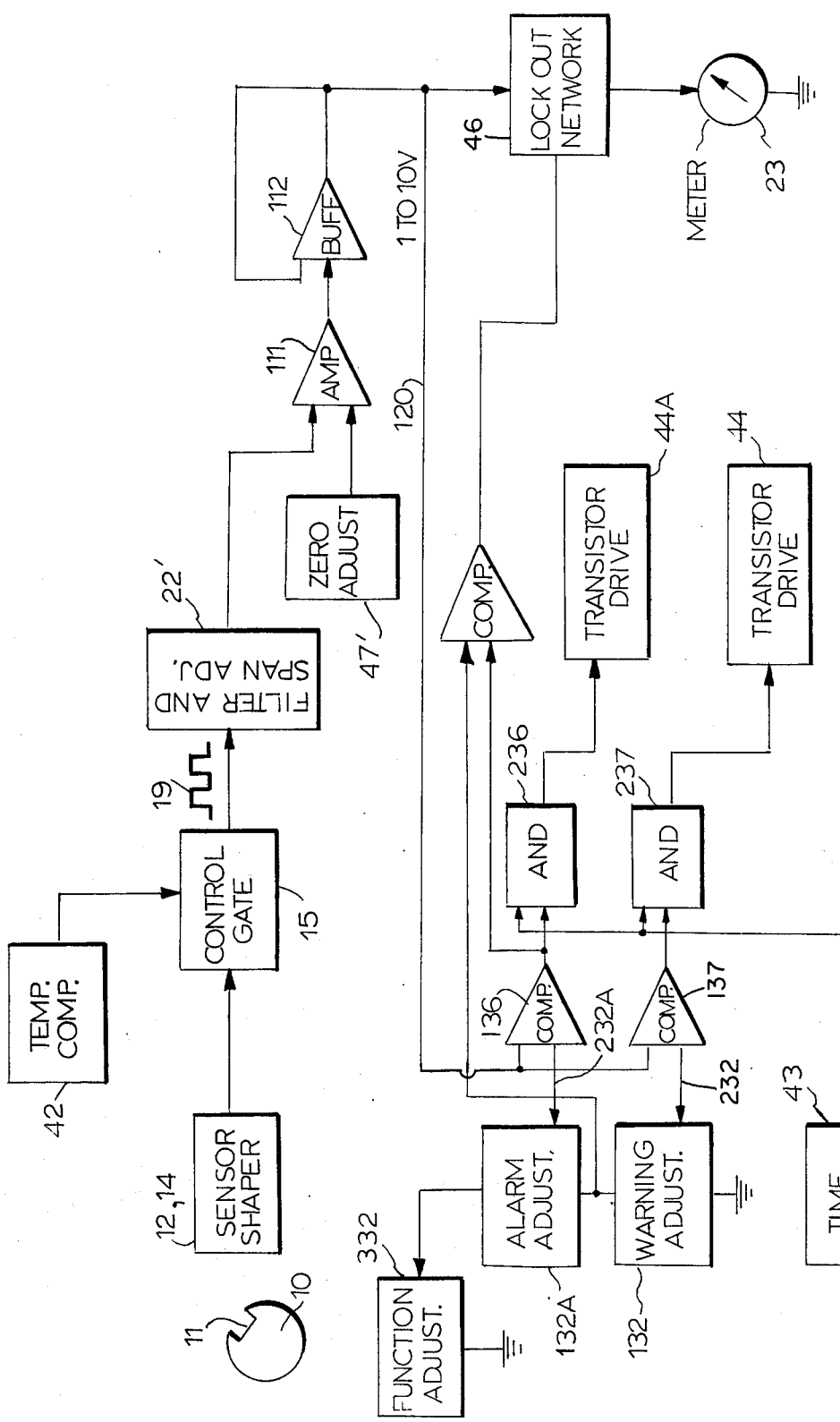
FIG. 6 is a block circuit diagram of a preferred analog embodiment of the invention.

As shown in block diagram form in FIG. 6 is a simpler analog embodiment of the invention, which operates on the same general principles, and incorporates some of the same elements of the embodiment of FIGS. 4 and 5. For ready comparison, like reference characters are used to indicate similar functional circuits.

Basically the variable duration B signal pulses 19 are converted in the filter circuit 22' to a d-c motor load signal level that varies in magnitude as a function of the duration of the signal pulses. This is the same signal used to operate analog meter movement 23 of FIG. 4. In this embodiment, the meter 23 is driven single-ended by amplifier 111 and buffer 112 by way of the gate lock out network 46. The zero meter output signal adjustment is made by zero adjust means 47' as an input to differential amplifier 111. Thus, a load signal level is derived and adjusted for span in circuit 22', and a zero level adjustment is available in circuit 47'. The resulting voltage level at lead 120 preferably has a voltage swing of 1 to 10 volts as derived from the control gate B pulses 19.

Analog comparison circuits 136 and 137 provide an output voltage for operating following AND circuits 236 and 237, if opened by time delay circuit 43, whenever the signal voltage level exceeds that of a variably selected input threshold level chosen in alarm circuits 132 and 132A, the adjustment feature thereof being indicated by an arrow head on the threshold leads 232 and 232A so that a threshold comparison voltage in the one to ten volt range will be made available at either comparator 136 or 137. A coarse adjustment of threshold ranges may be made available at lead 232 which includes a suitable input source of d-c potential.

In operation therefore the comparison devices 136 and 137 will provide a signal at transistor output circuits 44 and 44A whenever the motor load exceeds a predetermined value represented by voltage threshold settings on circuits 132, 132A. This output analog signal amounts to a gating signal that may be used to control utilization circuits of various kinds by operating relays or the like, as in the previously described embodiment.

Figure 7:
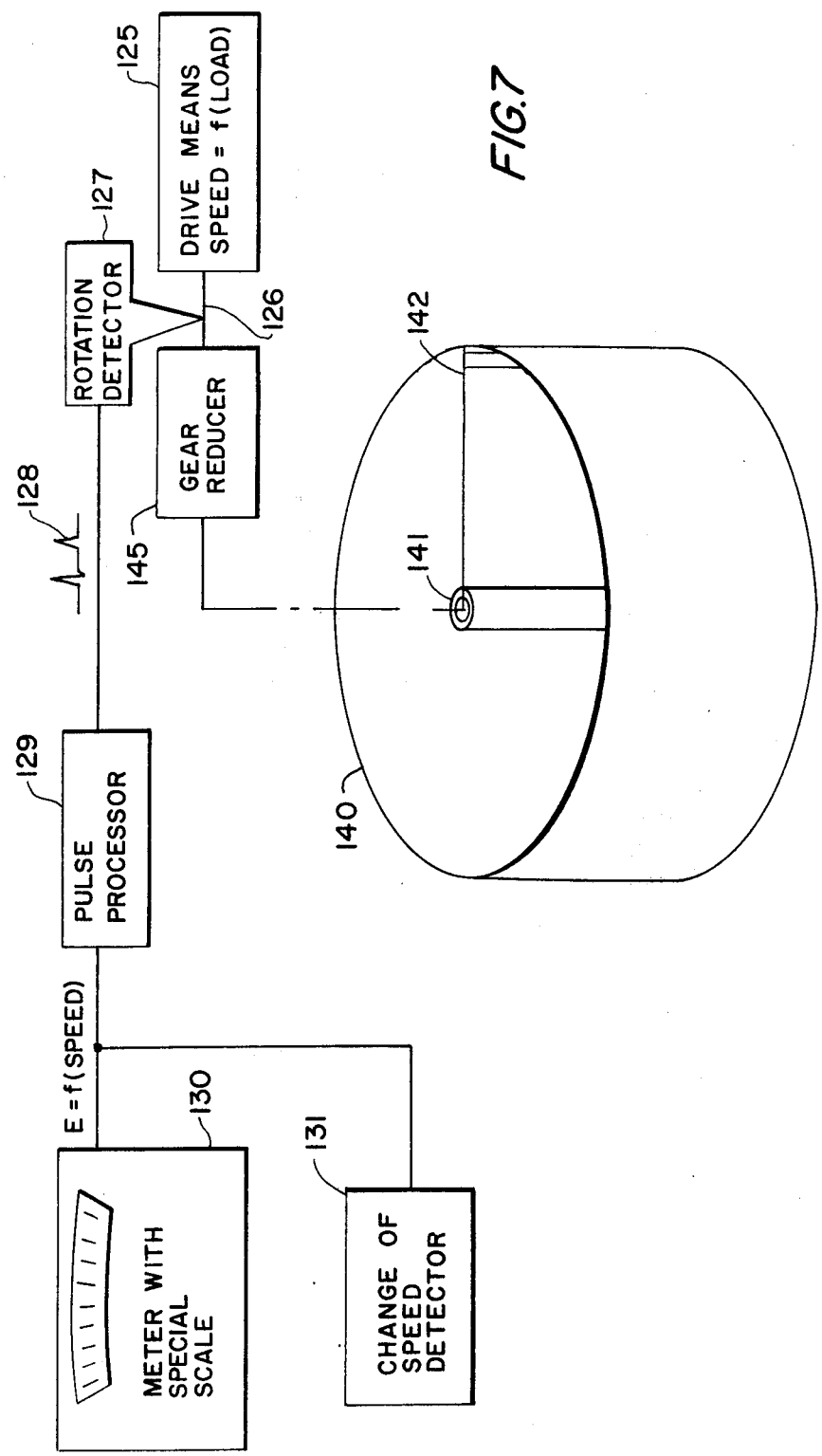
FIG. 7 is a system diagram setting forth the operational principles of the invention.

The principles of this invention are set forth in more general form in the system diagram of FIG. 7. Thus the drive means 125 may be an engine or motor (other than synchronous) which has a speed function that varies with load. The speed is detected as a function of the rotation of a shaft 126, for example, by means of a rotation detector 127 conveniently of the type hereinbefore described to produce output pulses 128, in this case electronic signals.

Such output pulses 128 comprise a train or sequence of individual pulses having interval spacings or repetition rate frequencies that are a function of the rotation speed of shaft 126. These pulses are processed by means 129 to provide an output signal E as a function of the drive means speed, conveniently in the form of voltage or current.

The output indicator may be a visually indicating meter 130 which is calibrated to have a special scale reading directly in speed, load, horsepower, etc., as will hereinafter be discussed more completely. An alternate form might be an alarm or change of speed detector 131 calibrated for producing an output in response to a predetermined variation of normal speed for example. In one form this could be a relay type meter. In the simplest form where accuracy is not important the meter 130 could simply integrate as with an R-C circuit the series of pulses which were standardized in shape and amplitude by pulse processor device 129. Then the meter reading would be a function of repetition rate which would reflect the speed of the drive means 125.

The load device on the drive means 125 in this case is shown as an industrial processor 140 such as a bakery mixer or a sludge processor having a rotatable shaft 141 and work arm 142 driven by drive means 125 through a gear reducer box 145.

Because of the use of a gear reducer which may provide for example a 20,000 to 1 reduction of the drive shaft speed, the drive means is particularly sensitive to overloads. Thus a half horsepower induction motor operating at full load RPM of 1725 may drive a 50 foot (15.24 meter) diameter clarifier in a sewage disposal plant to process a sludge load having an average of seven pounds per foot (30.48 cm) through gear box 145 with an overall efficiency of 60%.

Under such conditions an overload on work arm 142 would significantly increase the load on the motor (drive means 125), which could be readily sensed to produce an alarm from detector 131 or to produce a scale reading on meter 130 or an equivalent recording chart of the instantaneous dynamic load conditions at all times.

It has been shown heretofore how to produce a scale factor on meter 130 as a linear function of load on the motor from the display of FIG. 3, which is directly related to the slip characteristics of an induction motor. However, the scale can also be made to read directly in horsepower. In such case some simple calculations show how a linear meter scale can produce a reading in horsepower for the system being monitored, which meter therefore requires only a simple scale factor change to show load, motor, slip or horsepower. It is noted that if an induction motor is not used, but an internal combustion motor, the measured intervals of rotation of the shaft 126 can be converted to a direct meter scale reading in horsepower, which may be more meaningful, and more convenient for many industrial applications.

To calculate an exemplary scale factor for reading the instantaneous dynamic horsepower of the drive means on the scale of meter 130 consider the following:

Horsepower is equal to $$\frac{\text{Torque load} \times \text{RPM}}{K} \quad (1)$$

where the constant $k$ is a function of units and the place of measurement of RPM. Efficiency can be expressed as a ratio of output horsepower to input horsepower which in the aforesaid application is 60%. As seen from FIG. 3 abscissa the slip is proportional to load horsepower percentage. With said 50 ft. (15.24 meter) diameter clarifier with an average load of 7 lbs. per ft. of sludge load each pound per foot (30.48 cm) of build up of sludge on the scraper arm (142 FIG. 7) can be registered directly on the special scale of meter 130.

If the meter normally registers 75 to 125% of load as discussed hereinbefore, this represents 50% of the total motor horsepower on a linear scale. With 100 scale divisions each division then can be identified as 0.005 horsepower at the motor shaft with the half horsepower motor.

If the meter is to read in pounds per foot build up of sludge on the scraper arm 142, then the loading on the clarifier output drive is considered. With the 20,000 to 1 reducer on RPM, the horsepower is ascertained by equation (1) above and the efficiency factor is introduced we can determine the 100% meter scale position to be 0.12 input Hp. Then with a loading of 8 lbs. per foot the same process shows input Hp = 0.1388 or 0.0188 Hp per ft. of sludge. Converting this by dividing the motor rating 0.0188/5 Hp = 3.76% increase of Hp at the motor, which is equal to 3.76 scale divisions. Therefore new meter scale markers can be so identified to produce special output readings in terms of the arbitrary loading factor discussed above or in terms with other terms meaningful to the process or project at which the load monitoring equipment of this invention is employed.

Figure 8:
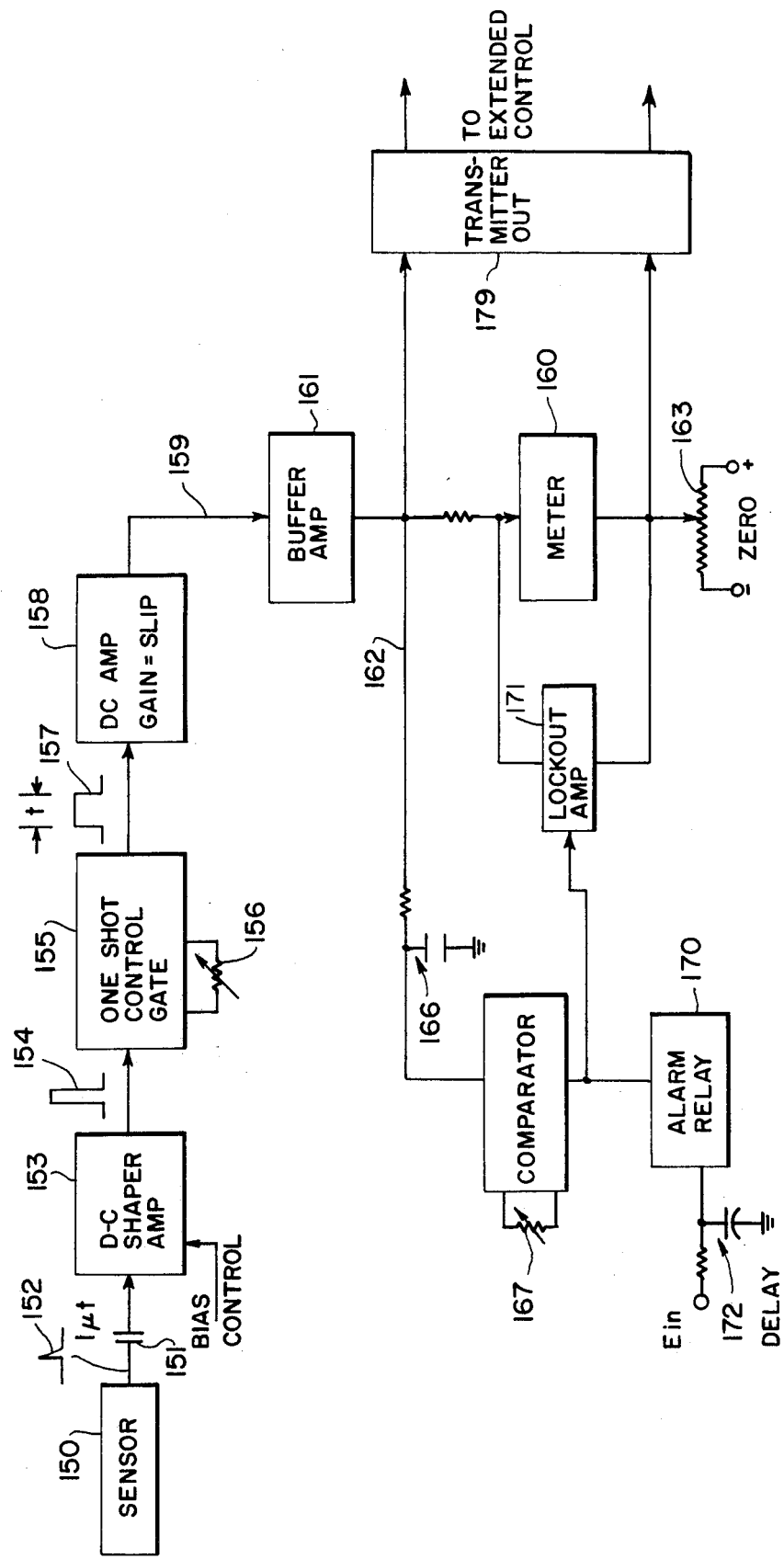
FIG. 8 is a block system diagram of a preferred electrical circuit embodiment of the invention.

FIG. 8 represents a preferred circuit block diagram of a system constructed in accordance with the principles hereinbefore explained, particularly with respect to the general system operation set forth in FIG. 4.

A shaft rotation sensor 150 which may be Airpax No. 40004 provides an output pulse 152 of about 130 m.v. a-c connected by capacitor 151 to d-c shaper amplifier 153 which produces a saturated 12 v output pulse 154. The leading edge then fires a one-shot gate control circuit 155 set by adjustment 156 for a nominal gate length $t$ of gate waveform 157 of 3.5 m.s. (corresponding to the waveform of FIG. 2). D.C. Amplifier 158 has a characteristic that the gain is equal to the slip so that the output 159 therefore drives meter 160 through a buffer amplifier 161 which permits a feed off circuit 162 without loading the meter. A meter zero circuit 163 as hereinbefore described permits setting of the meter mid-scale at 100% load for example.

An integrator circuit 166 together with adjustment 167 permits comparator amplifier to operate for any continued overload to fire an alarm relay 170. Also it may serve by means of lockout amplifier 171 to disconnect or shunt the meter 160. To prevent false alarms when the system is first energized, an input current delay circuit 172 is provided to the alarm amplifier and relay circuit 170.

As seen from FIG. 8 external circuits may be controlled by an appropriate output circuit 179. These circuits of FIG. 8 for example may have the more detailed configurations shown in FIGS. 9 and 10.

Figure 9:
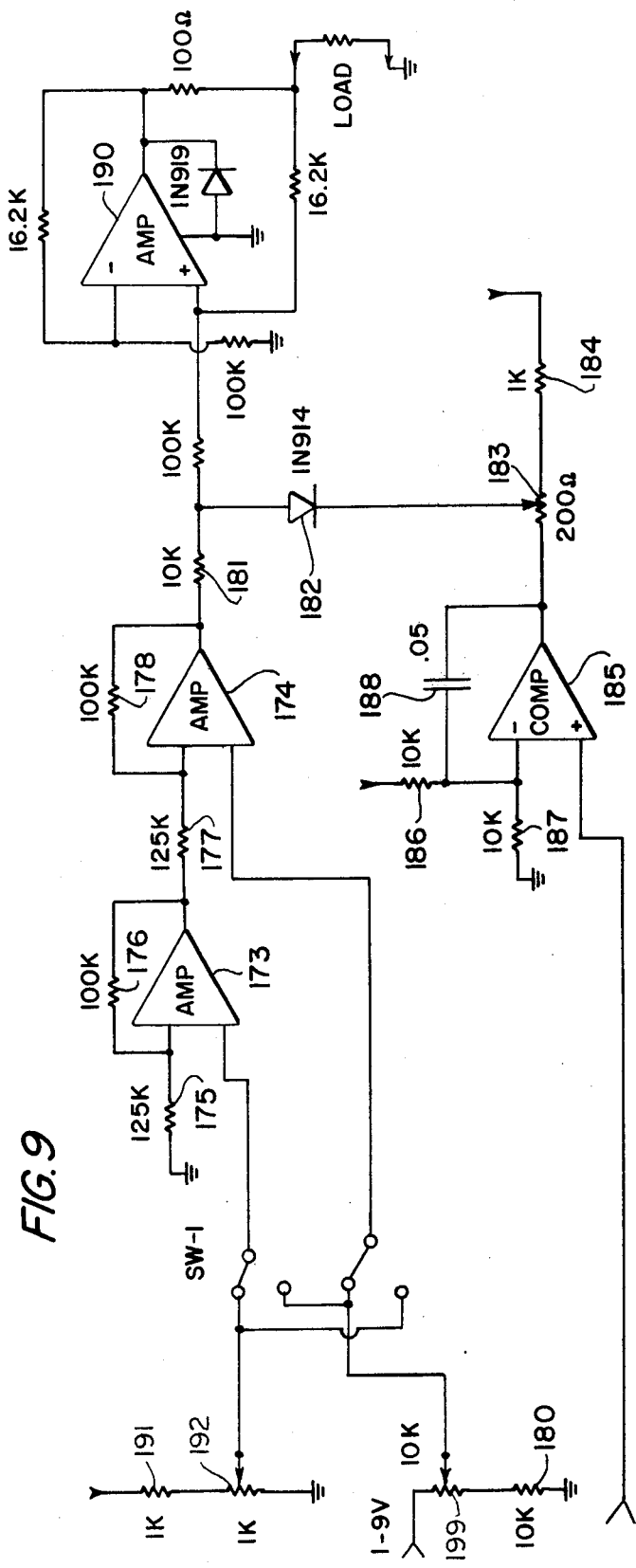
FIG. 9 is a schematic circuit diagram of an output control circuit embodiment of the invention.

In FIG. 9, resistors 191, 192 set up the zero bias adjust for the low D.C. current drift instrumentation amplifier 173, 174. Resistors 175 to 178 set up a gain of about 1.25. Resistors 199 and 180 serve as a span adjust for the instrumentation amplifier. Elements 181 to 185 make up a lock out circuit to insure that the transmitter puts out 4 to 20 milliamperes at the start up time. Resistors 186 and 187 serve as a mid-point bias system or pivot point from which the comparator amplifier 185 may switch. Capacitor 188 prevents oscillations and resistor 183 is adjusted so that with a low signal into comparator 185 there is a 4 milliampere output from the output amplifier 190, a bilateral current source such as described in may U.S. Pat. no. 3,906,796. With a high signal into the input of comparator 185 diode 182 is back biased and the output of amplifier 174 is free to control the bilateral current source 190.

Figure 10:
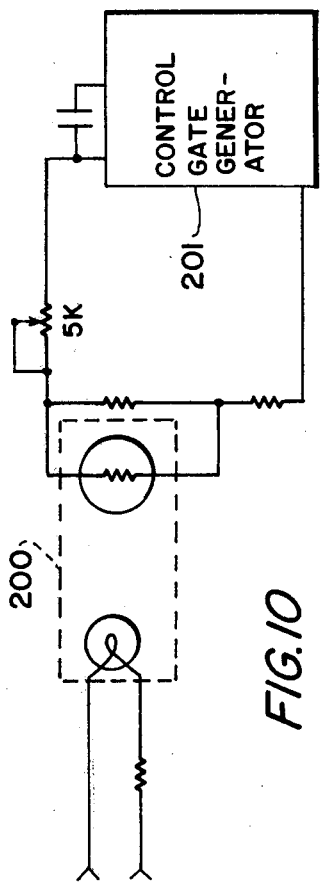
FIG. 10 is a further such control circuit embodiment.

In FIG. 10 an optical isolating converter 200 drives a control gate generator 201 such as a multivibrator which will produce a frequency or an average voltage or current as a function of the speed of the drive system. This permits a correction of the changes in speed, or other control or analysis functions of the torque or speed of the drive.

Accordingly, it is evident that this invention as set forth by the hereinbefore described preferred embodiments provides a simple and improved load monitoring and control system which has advantages of accuracy, simplicity, simple installation versatility and wide range of controls.

What is claimed is:

1. Instrumentation for measuring load conditions of an induction motor comprising in combination,
   electronic sensor means coupled for response to the speed of said motor providing a sequence of discrete electronic trigger pulses which vary in repetition frequency as a function of motor speed,
   a waveform generator responsive to said trigger pulses from said sensor means calibrated to generate a control waveform of fixed time length duration shorter than the time between two successive trigger pulses provided at a speed representative of a predetermined load on said motor and producing variable duration signal pulses representative of the difference in time between two successive trigger pulses and said fixed length waveform,
   and monitoring means responsive to said signal pulses to show the load condition of said motor over a representative range of load values.

2. Instrumentation as defined in claim 1, wherein said monitoring means comprises an analog meter and corresponding circuit providing meter readings as a function of the duration of said signal pulses.

3. Instrumentation as defined in claim 1, wherein said monitoring means comprises a flip-flop circuit and waveform analysis circuits causing said flip-flop circuit to switch to an alarm condition responsive to signal pulse durations exceeding a predetermined load condition of said motor.

4. Instrumentation as defined in claim 3, wherein said waveform analysis circuits comprise means generating a threshold pulse of selectively variable duration in response to each one of said trigger pulses thereby representing a predetermined alarm threshold, and a comparison circuit which triggers said flip-flop circuit when said signal pulses surpass in time duration the threshold pulse duration.

5. Instrumentation as defined in claim 4, wherein a time delay circuit is provided inhibiting said comparison circuit during motor start periods.

6. Instrumentation as defined in claim 4 including means automatically resetting said flip-flop circuit to remove said alarm condition when the signal pulse is reduced in time duration to become shorter than the threshold pulse duration.

7. Instrumentation as defined in claim 1, wherein said monitoring means comprises an electronic circuit producing from said variable duration signal pulses a d-c load signal level that varies as a function of said variable duration of the signal pulses.

8. Instrumentation as defined in claim 7 including means selecting at least one d-c threshold level representative of a predetermined load condition value of said d-c level load signal, and means comparing said threshold level and load signal level to produce an output utilization signal.

9. The method of measuring slip of an induction motor having a rotating shaft comprising the steps of,
   deriving electronic trigger signals in response to the motor shaft rotation,
   establishing a fixed duration time digital electronic pulse in response to each trigger signal,
   and indicating variations of slip speed by variable length pulses as a function of the time difference between the fixed duration pulse and the duration between two successive trigger signals.

10. The method defined in claim 9 including the steps of calibrating said fixed duration pulse to produce a predetermined time difference at a full load motor operational load condition, and sensing a condition where said time difference exceeds by a specified time said predetermined time difference as a motor overload indication.

11. The method defined in claim 9, wherein said fixed duration time electronic pulse is derived to identify a predetermined motor load value residing in the linear portion of the slip speed curve for a particular motor characteristic.

12. The combination of: drive means whose speed varies with load, means operable from rotation of said drive means producing repetitive signal pulses each derived in response to a predetermined measure interval of rotation of said drive means and load determining means determining from said signal pulses, signal pulses of variable duration having a duration identifying speed of said drive means and thereby signifying the load.

13. The combination as defined in claim 12 including an indicator meter responsive to said variable duration pulses to display a reading which is a dynamic function of instantaneous speed of said drive means.

14. The combination defined in claim 13 wherein the meter has a scale calibrated in a measure of the load of said drive means.

15. The combination defined in claim 13 wherein the meter has a scale calibrated in a measure of dynamic horsepower being delivered by said drive means.

16. The combination defined in claim 13 wherein the means operable from rotation of said drive means comprises a rotation sensing device producing a pulse for each rotation, a load driven by said drive means through a gear reducer, and a scale calibration on said meter calibrated as a function of the load of said drive means.

17. The combination as defined in claim 12 including an indication device providing a signal from a predetermined change of speed of said drive means.

18. The combination as defined in claim 12, wherein the load determining means includes a control circuit for driving an external circuit.

19. The combination defined by claim 18, wherein the control circuit comprises an optical coupling link and associated generator circuit which converts a signal from said load determining means to a control function with an output parameter which is a function of the speed of said drive means.

20. The combination as defined by claim 18, wherein the control circuit comprises a lock out circuit which produces a variable current output within a specified current range over which the current is a function of the speed of said drive means.

* * * * *